United States Patent [19]
Kawamoto

[11] Patent Number: 5,394,373
[45] Date of Patent: Feb. 28, 1995

[54] SEMICONDUCTOR MEMORY HAVING A HIGH-SPEED ADDRESS DECODER

[75] Inventor: Satoru Kawamoto, Kasugai, Japan

[73] Assignee: Fujitsu Limited, Kawasaki, Japan

[21] Appl. No.: 854,642

[22] PCT Filed: Nov. 15, 1991

[86] PCT No.: PCT/JP91/01563

§ 371 Date: Jul. 7, 1992

§ 102(e) Date: Jul. 7, 1992

[87] PCT Pub. No.: WO92/09084

PCT Pub. Date: May 29, 1992

[30] Foreign Application Priority Data

Nov. 16, 1990 [JP] Japan .................. 2-310566

[51] Int. Cl.⁶ .................................. G11C 8/00
[52] U.S. Cl. ..................... 365/230.06; 365/230.08; 365/233; 365/189.05
[58] Field of Search ............ 365/230.06, 230.08, 365/189.05, 233, 201

[56] References Cited

U.S. PATENT DOCUMENTS

| | | | |
|---|---|---|---|
| 4,603,405 | 7/1986 | Michael | 365/201 |
| 4,951,258 | 8/1990 | Uehara | 365/222 |
| 4,984,216 | 1/1991 | Toda et al. | 365/230.08 |
| 5,073,873 | 12/1991 | Nogami | 365/230.08 |

FOREIGN PATENT DOCUMENTS

| | | |
|---|---|---|
| 0370460 | 5/1990 | European Pat. Off. . |
| 0389202 | 9/1990 | European Pat. Off. . |
| 53-81020 | 7/1978 | Japan . |
| 55-4797 | 1/1980 | Japan . |
| 55-150191 | 11/1980 | Japan . |
| 59-157891 | 9/1984 | Japan . |
| 60-167194 | 8/1985 | Japan . |
| 61-17291 | 1/1986 | Japan . |
| 61-126687 | 6/1986 | Japan . |
| 2-139793 | 5/1990 | Japan . |

*Primary Examiner*—Joseph A. Popek
*Attorney, Agent, or Firm*—Staas & Halsey

[57] ABSTRACT

A semiconductor memory comprises a memory cell array, a first address bus for transmitting an external address signal, a second address bus for transmitting an internal address signal, an address decoder, and a controller. The address decoder has a decoding portion for decoding an input address signal to select a word line of the memory cell array, and a switching portion for selecting one of the first and second address buses to provide the decoding portion with one of the external and internal address signals. The external and internal address signals can be transferred to the address decoder through the first and second address buses, respectively, according to an address activation signal before an operation mode is determined, thereby shortening the transferring time and decoding time and realizing high-speed memory accessing.

11 Claims, 17 Drawing Sheets

5,394,373

SEMICONDUCTOR MEMORY HAVING A HIGH-SPEED ADDRESS DECODER

TECHNICAL FIELD

This invention relates to a semiconductor memory, and particularly, to a semiconductor memory having a high-speed address decoder for decoding an address signal and selecting a memory cell.

BACKGROUND ART

Semiconductor memories in recent years are required to have added high values such as a high access speed and various operation modes. For example, a dynamic random access memory (DRAM) has two operation modes, i.e., a normal read/write operation mode based on an external address signal and a refresh operation mode based on an internal address signal provided by an address counter disposed on a chip. The DRAM must speedily decode these address signals for the operation modes.

The DRAM comprises, for example, memory cells, sense amplifiers, a column decoder, a word driver, a row address buffer, a clock generator, a mode decision circuit, and a switching circuit.

A normal read/write operation of the DRAM will be explained. The clock generator provides a control signal, according to which an address latch circuit in a buffer cell latches an external address signal through an input terminal thereof. The mode decision circuit determines an operation mode, and according to the determination, data of the external address signal latched by the address latch circuit is transferred to a row decoder through an address bus. The row decoder decodes the transferred data and provides the word driver with the decoded address to select a word line. Next, a refresh operation will be explained. The clock generator similarly provides a control signal, according to which the address latch circuit of the buffer cell latches an external address signal supplied to the input terminal. The mode decision circuit determines an operation mode, and according to the determination, data of an internal address signal is transferred to the row decoder to similarly select a word line.

To reset the chip, a selected word line is reset at first according to a reset signal. Then, the clock generator 86 changes the control signal, and in response to the change, the mode decision circuit provides a mode signal of predetermined level, which causes the switching circuit to change switching control signals. As a result, signal lines of the address bus and then the decoded address are reset.

In this way, according to the conventional row-system controller, the external or internal address signal is provided to the address bus only after the mode decision circuit determines an operation mode according to row address and column address strobe signals and after the operation mode signals are set to a level indicative of the operation mode. Accordingly, the conventional semiconductor memory has problems of extending a decoding time and slowing an access speed. When resetting the chip, a selected word line must be discharged at first before resetting an address bus for the word line and a decoded address. This makes it difficult to shorten a reset time and cycle time.

DISCLOSURE OF THE INVENTION

An object of the invention is to shorten a decoding time of an address decoder as well as a memory access time. Another object of the invention is to shorten the chip reset time and improve the cycle time.

According to a first aspect of the invention, there is provided a semiconductor memory comprising a memory cell array, a first address bus for transmitting an external address signal according to an address activation signal, a second address bus for transmitting an internal address signal according to the address activation signal, an address decoder including a decoding portion for decoding an input address signal thereby to select a word line of the memory cell array and a switching portion for selecting one of the first and second address buses so that one of the external and internal address signals is provided to the decoding portion, and a controller for determining, according to the address activation signal, an operation mode to control the switching portion.

The address decoder may have a latch portion for latching a decoded result of the decoding portion.

According to a second aspect of the invention, there is provided a semiconductor memory comprising a memory cell array, a first address bus for transmitting an external address signal according to an address activation signal, a second address bus for transmitting an internal address signal according to the address activation signal, an address decoder including a first decoding portion for decoding the external address signal transmitted through the first address bus, a second decoding portion for decoding the internal address signal transmitted through the second address bus, and a switching portion for selecting one of decoded results of the first and second decoding portions and thereby choosing a word line of the memory cell array, and a controller for determining, according to the address activation signal, an operation mode to control the switching portion.

The address decoder may have a latch portion for latching an output of the switching portion.

According to a third aspect of the invention, there is provided a semiconductor memory having a memory cell array and an address decoder for decoding an address signal and selecting a memory cell of the memory cell array. The address decoder comprises a latch portion for latching a decoded result.

In the first, second, and third aspects of the invention, the address decoder may be formed as a row decoder employed for a dynamic random access memory. Also, the address decoder may be formed as a predecoder of a row decoder.

BEST MODE OF CARRYING OUT THE INVENTION

Before explaining semiconductor memories according to embodiments of the invention, row-system controllers and address buffers (row address buffers) of conventional DRAMs will be explained with reference to FIGS. 1 to 5.

Figure 1:
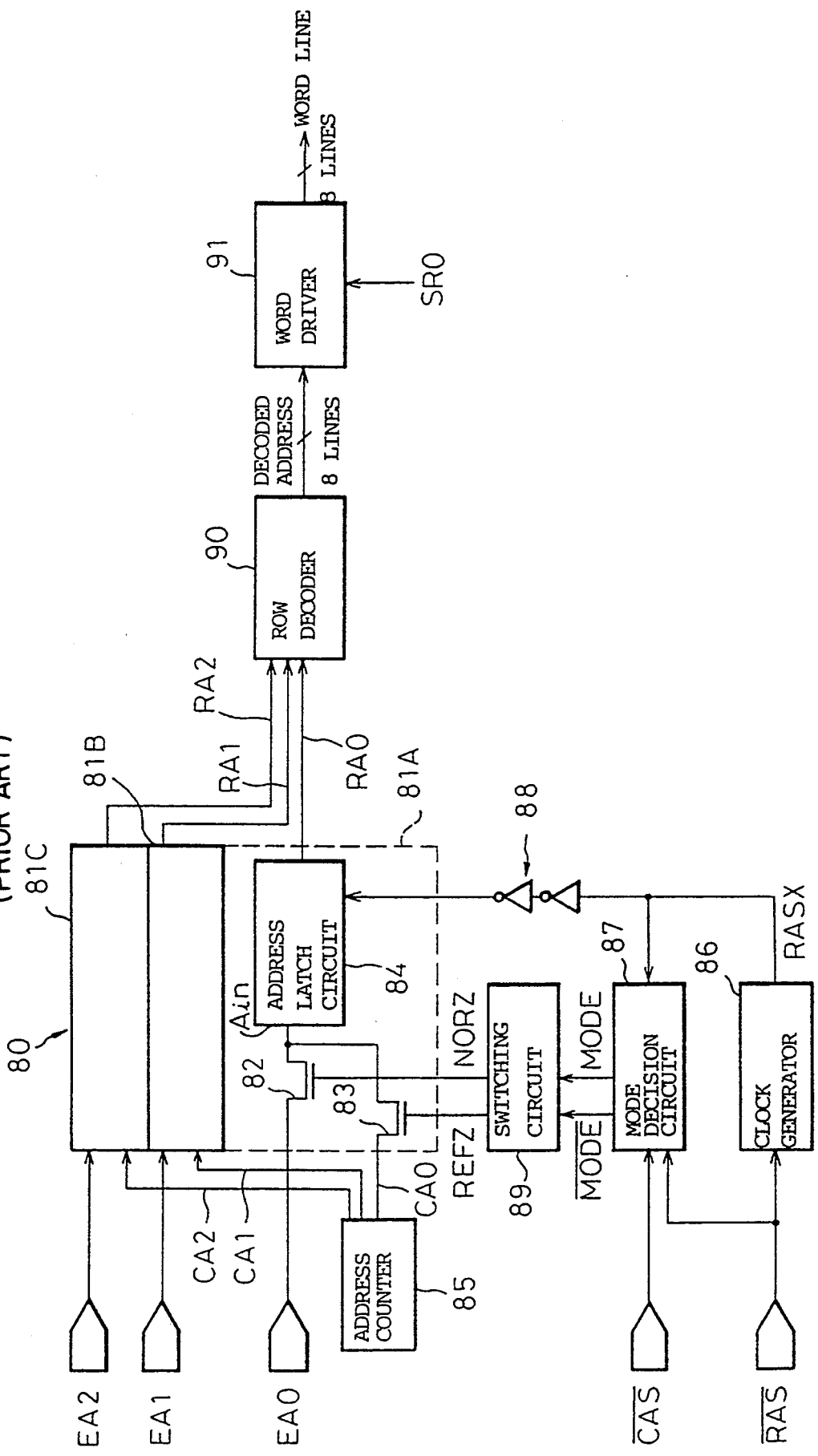
FIG. 1 (Prior Art) is a block circuit diagram showing an example of a conventional semiconductor memory.
Figure 2:
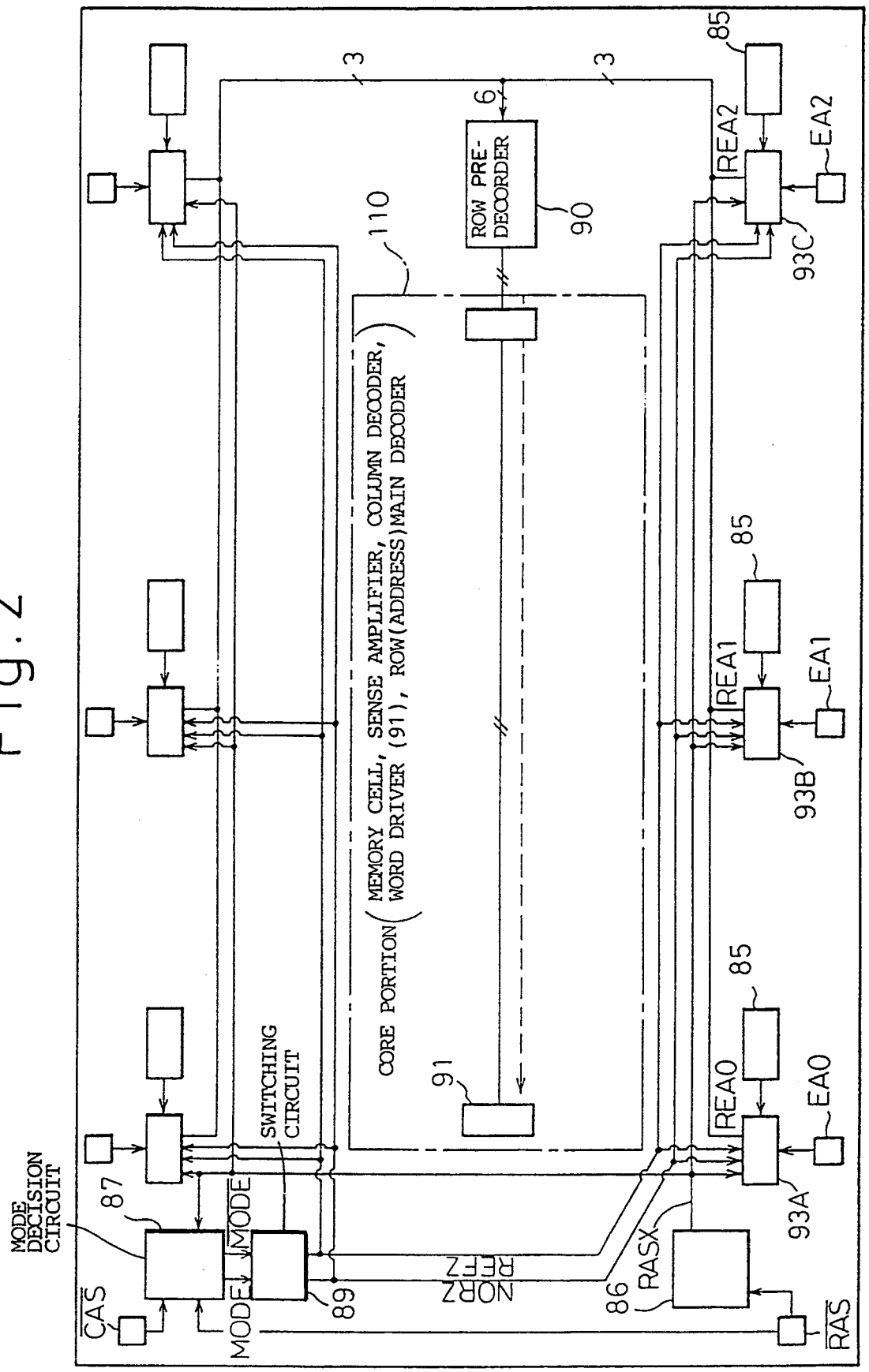
FIG. 2 is a chip layout of the semiconductor memory of FIG. 1.

FIG. 1 is a block circuit diagram showing a conventional semiconductor memory, and FIG. 2 is a chip layout of the semiconductor memory of FIG. 1. In FIG. 2, a core portion 110 includes memory cells, sense amplifiers, a column decoder, a word driver (91), and a row (address) main decoder.

In FIG. 1, a row address buffer 80 comprises three buffer cells 81A to 81C. Each of the buffer cells 81A to 81C as shown in buffer cell 81A, comprises first and second switches 82 and 83 each made of an NMOS transistor, and an address latch circuit 84. The first switches 82 of the buffer cells 81A to 81C receive bits EA0 to EA2, respectively, of a 3-bit external address signal EA. The second switches 83 of the buffer cells receive bits CA0 to CA2, respectively, of a 3-bit internal address signal CA. The internal address signal CA is provided by an address counter 85 disposed on a chip.

A clock generator 86 provides a mode decision circuit 87 with a control signal RASX according to a row address strobe signal e,ovs/RAS/ . The control signal RASX is also provided to the address latch circuits 84 of the buffer cells 81A to 81C through a delay circuit 88.

When the row address strobe signal $\overline{RAS}$ changes to level L (low) with a column address strobe signal $\overline{CAS}$ being at level H (high), the mode decision circuit 87 determines that it is a normal read/write operation, and provides mode signals MODE of level H and $\overline{MODE}$ of level L. When the row address strobe signal $\overline{RAS}$ changes to level L with the column address strobe signal $\overline{CAS}$ being at level L, the mode decision circuit 87 determines that it is a refresh operation of the memory cell array (formed in the core portion 110 of FIG. 2), and provides mode signals MODE of level L and $\overline{MODE}$ of level H.

When the mode decision circuit 87 provides the mode signals MODE and $\overline{MODE}$ of levels H and L, respectively, a switching circuit 89 provides switching control signals NORZ and REFZ of levels H and L, respectively. When the mode signals MODE and $\overline{MODE}$ are levels L and H, respectively, the switching circuit provides switching control signals NORZ and REFZ of levels L and H, respectively.

Figure 3:
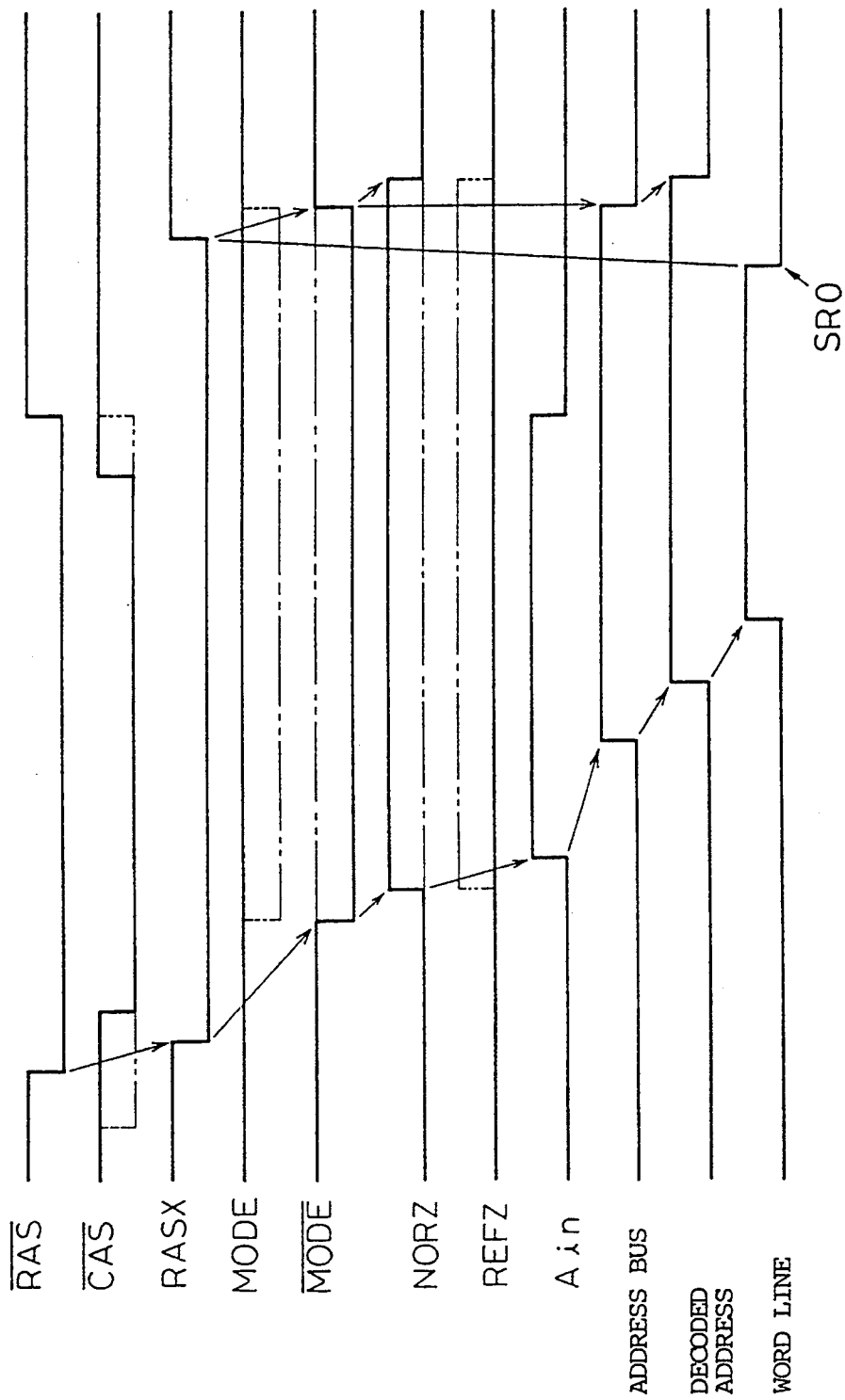
FIG. 3 is a timing chart explaining operations of the semiconductor memory of FIG. 1.

FIG. 3 is a timing chart explaining operations of the semiconductor memory of FIG. 1.

In the normal read/write operation indicated with a continuous line in FIG. 3, the switching circuit 89 sets the switching control signal NORZ to level H to turn ON the switches 82 of the buffer cells 81A to 81C of the row address buffer 80. Then, the bits EA0 to EA2 of the external address signal EA are supplied to input terminals Ain of the address latch circuits 84, and according to the control signal RASX from the clock generator 86, latched by the address latch circuits 84 of the buffer cells 81A to 81C, respectively. The bit data EA0 to EA2 latched by the address latch circuits 84 are transferred to a row decoder 90 through signal lines RA0 to RA2 of an address bus RA. The row decoder 90 decodes the bit data on the signal lines RA0 to RA2, and a decoded address is transferred to a word driver 91 through signal lines, to select a word line.

A refresh operation is now explained. The switching circuit 89 sets the switching control signal REFZ to level H to turn ON the switches 83 of the buffer cells 81A to 81C. Then, the bits CA0 to CA2 of the internal address signal CA are supplied to the input terminals Ain of the address latch circuits 84 to select a word line in a manner similar to the previous case. In FIG. 3, dash-and-two-dots lines indicate statuses of signals during the refresh operation.

A chip reset operation is now explained. In FIG. 3, a reset signal SR0 resets a selected word line. Thereafter, the clock generator 86 changes the control signal RASX to level H, and according to this change, the mode signal MODE or $\overline{MODE}$ of the mode decision circuit 87 returns to level H. When the mode signal MODE or $\overline{MODE}$ returns to level H, the switching circuit 89 changes the switching control signals NORZ and REFZ to level L, to reset the signal lines RA0 to RA2 of the address bus RA as well as a decoded address.

Figure 4:
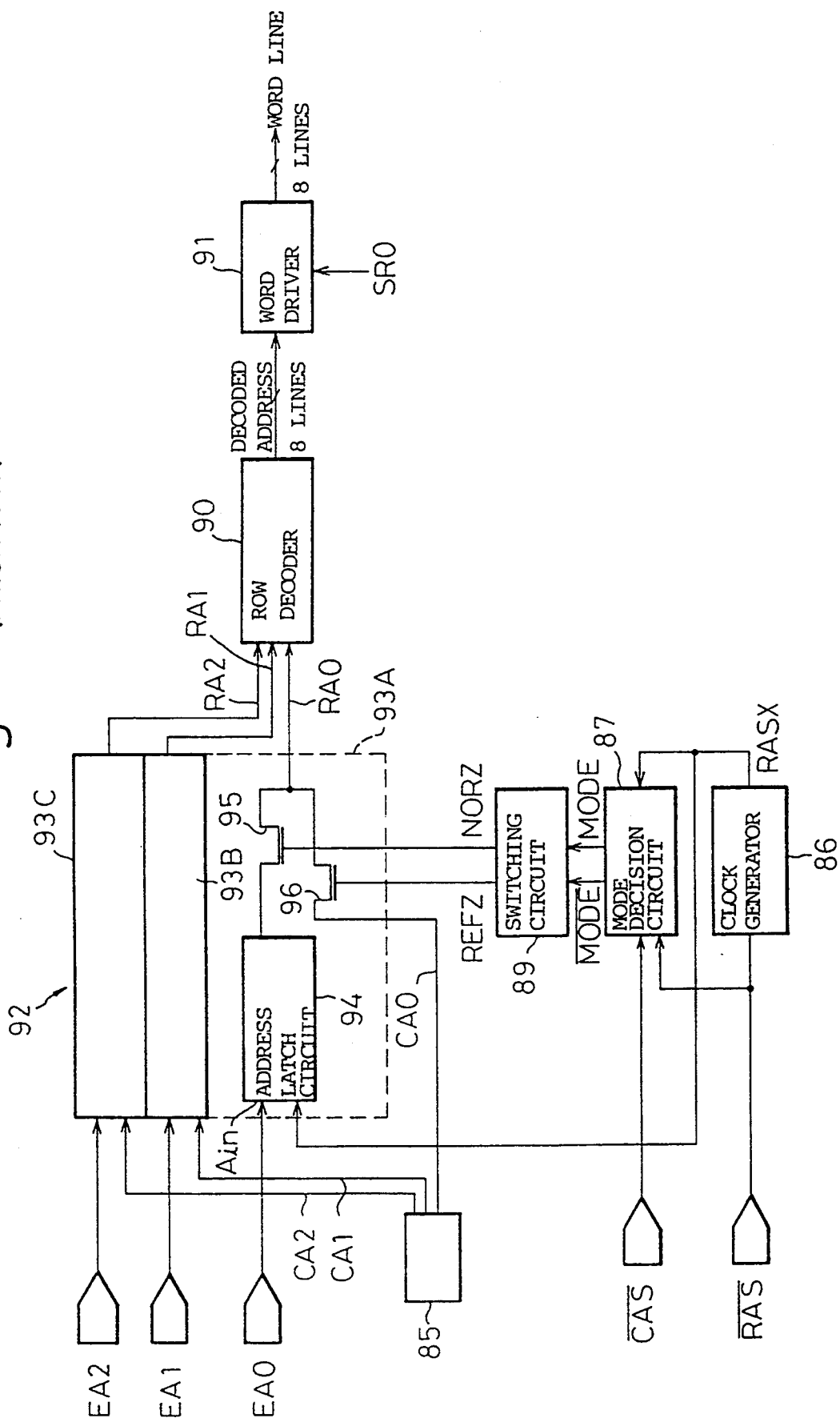
FIG. 4 (Prior Art) is a block circuit diagram showing another example of a conventional semiconductor memory.

FIG. 4 is a block circuit diagram showing another conventional semiconductor memory.

In FIG. 4, a row address buffer 92 comprises three buffer cells 93A to 93C. Each of the buffer cells comprises an address latch circuit 94 having an input terminal Ain for receiving one of corresponding bit data EA0 to EA2 of an external address signal EA, a first switch 95 connected to an output terminal of the address latch circuit 94, and a second switch 96 for receiving a one of corresponding bits CA0 to CA2 of an internal address signal CA provided by an address counter 85 disposed on a chip.

Figure 5:
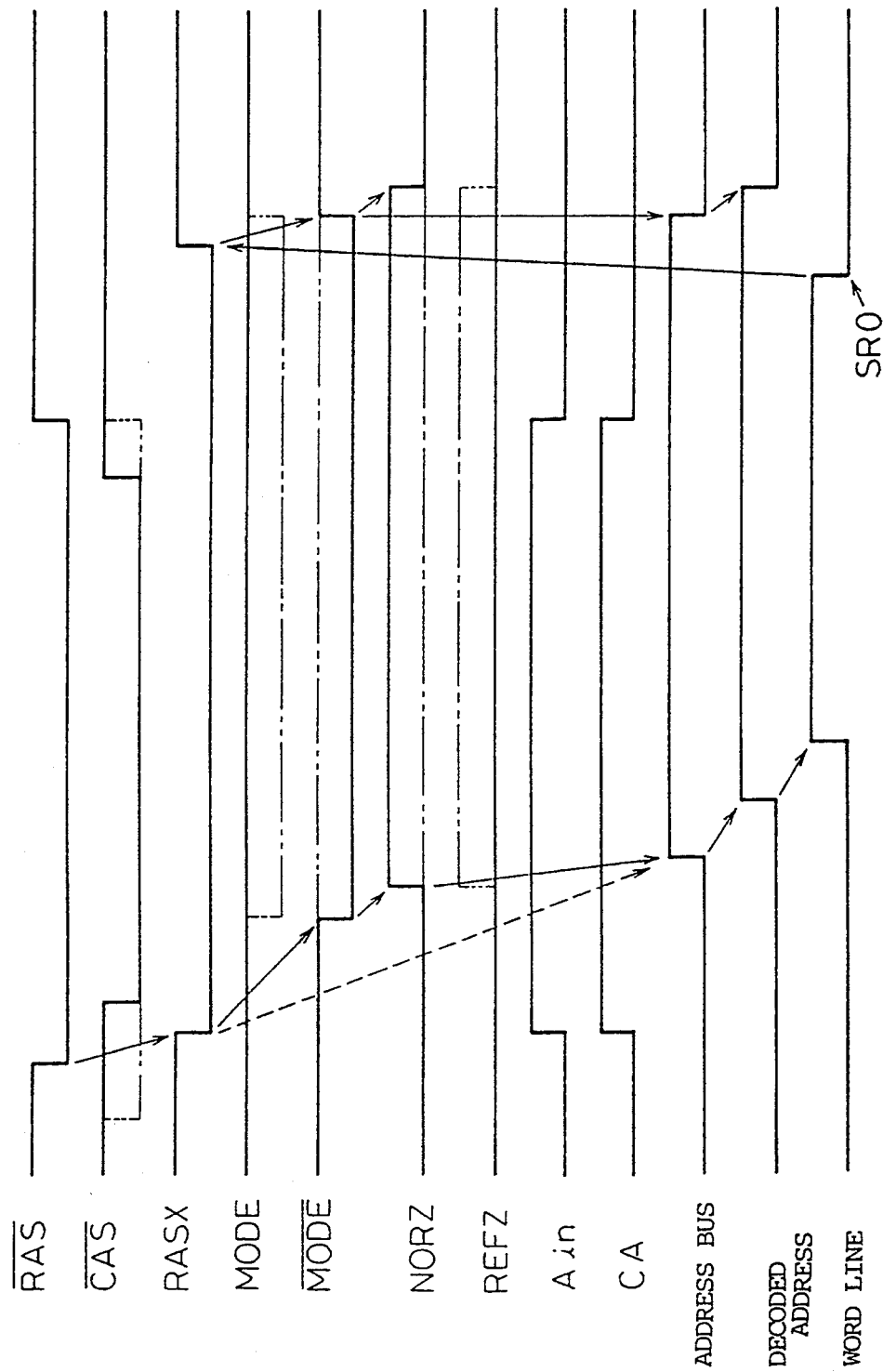
FIG. 5 is a timing chart explaining operations of the semiconductor memory of FIG. 4.

FIG. 5 is a timing chart explaining operations of the semiconductor memory of FIG. 4.

First, a normal read/write operation will be explained. As indicated with continuous lines in FIG. 5, a clock generator 86 provides a control signal RASX, according to which the address latch circuits 94 of the buffer cells 93A to 93C latch the bit data EA0 to EA2 of the external address signal EA supplied to the input terminals Ain. A mode decision circuit 87 determines an operation mode, according to which a switching circuit 89 provides a switching control signal NORZ of level H to turn ON the switches 95 of the buffer cells 93A to 93C. Then, the bit data EA0 to EA2 latched by the address latch circuits 94 are transferred to a row decoder 90 through signal lines RA0 to RA2 of an address bus RA. The row decoder 90 decodes the bit data on the signal lines RA0 to RA2 and provides a word driver 91 with a decoded address through signal lines. The word driver selects a word line accordingly.

A refresh operation is now explained. Similarly to the above, the clock generator 86 provides a control signal RASX, according to which the address latch circuits 94 of the buffer cells 93A to 93C latch the bit data EA0 to EA2 of the external address signal EA supplied to the input terminals Ain. Thereafter, the mode decision circuit 87 determines an operation mode, according to which the switching circuit 89 provides a switching control signal REFZ of level H to turn ON the switches 96 of the buffer cells 93A to 93C. Then, bit data CA0 to CA2 of an internal address signal CA are transferred to the row decoder 90 through the signal lines RA0 to RA2 of the address bus RA, to select a word line in a manner similar to the above. In FIG. 5, dash-and-two-dots lines indicate statuses of signals during the refresh operation.

A chip reset operation will be explained. In FIG. 5, a selected word line is reset according to a reset signal SR0, and the clock generator 86 changes the control signal RASX to level H. According to this change, the mode decision circuit 87 returns the mode signal MODE or $\overline{MODE}$ to level H. When the mode signal MODE or $\overline{MODE}$ is returned to level H, the switching circuit 89 changes the switching control signals NORZ and REFZ to level L to reset the signal lines RA0 to RA2 of the address bus RA as well as a decoded address.

As mentioned above, the conventional row-system controller provides the address bus RA with either the external or internal address signal only after the mode decision circuit 87 determines an operation mode according to the row address and column address strobe signals $\overline{RAS}$ and $\overline{CAS}$ and after the mode decision circuit sets one of the mode signals (operation mode signals) MODE and $\overline{MODE}$ to level L. This is the reason why the conventional semiconductor memory involves a long decoding time and a slow access speed.

Since the conventional semiconductor memory resets a decoded address and the address bus for selecting a word line only after a selected word line is completely discharged, the reset time and cycle time can be shortend.

A principle of a semiconductor memory according to the invention will be explained with reference to FIGS. 6 to 8.

Figure 6:
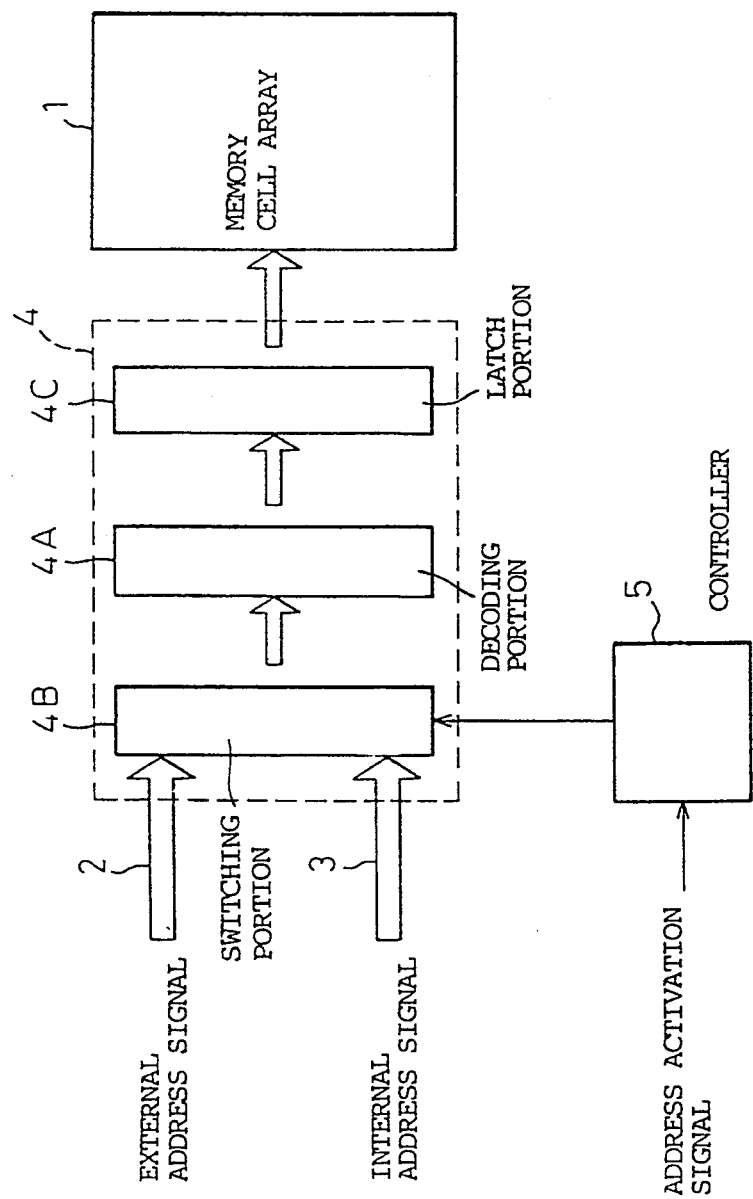
FIG. 6 is a block diagram showing a principle of a semiconductor memory according to a first aspect of the invention.

FIG. 6 is a block diagram showing a semiconductor memory according to a first aspect of the invention.

In FIG. 6, the semiconductor memory according to the first aspect of the invention has a first address bus 2 for transmitting an external address signal and a second address bus 3 for transmitting an internal address signal, according to an address activation signal.

An address decoder (row decoder) 4 comprises a decoding portion 4A, a switching portion 4B, and a latch portion 4C. The decoding portion 4A decodes an input address signal and selects a word line of a memory cell array 1. The switching portion 4B selects one of the first and second address buses 2 and 3, to provide the decoding portion 4A with one of the external and internal address signals. The latch portion 4C latches a decoded result of the decoding portion 4A.

A controller 5 determines an operation mode according to the address activation signal and controls the switching portion 4B of the row decoder 4.

According to the semiconductor memory of the first aspect of the invention, the external and internal address signals are transferred to the row decoder 4 through the first and second address buses 2 and 3, respectively, in response to the address activation signal, and before the controller 5 determines an operation mode according to the address activation signal. Thereafter, according to the operation mode determined by the controller 5, the switching portion 4B selects one of the first and second address buses 2 and 3 so that one of the external and internal address signals corresponding to the operation mode is transferred to the decoding portion 4A, which then decodes the signal. According to the decoded result, a word line of the memory cell array 1 is selected. This arrangement shortens a decoding time and realizes high-speed memory accessing.

Since a decoded result of the decoding portion 4A is latched by the latch portion 4C in selecting a word line, the first and second address buses 2 and 3 can be reset irrespective of resetting the selected word line when carrying out a chip reset operation. This shortens the reset time.

Figure 7:
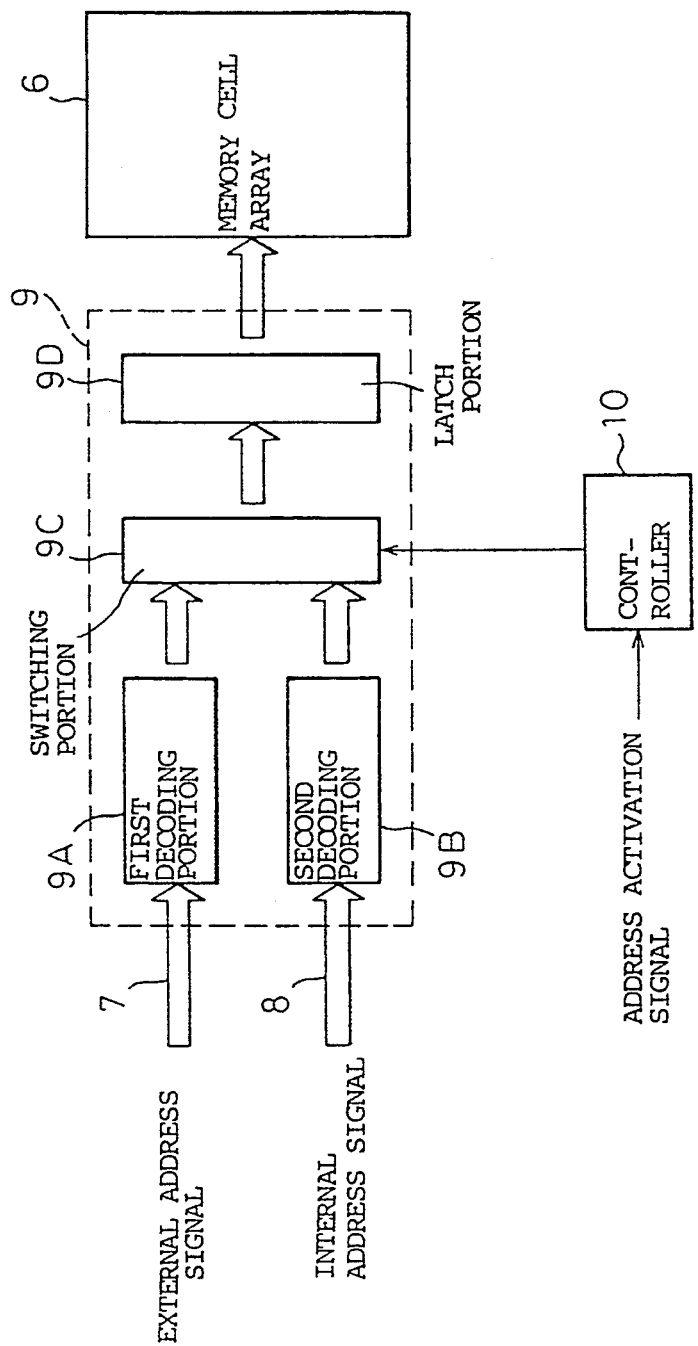
FIG. 7 is a block diagram showing a principle of a semiconductor memory according to a second aspect of the invention.

FIG. 7 is a block diagram showing a principle of a semiconductor memory according to a second aspect of the invention.

In FIG. 7, the semiconductor memory has a first address bus 7 for transmitting an external address signal and a second address bus 8 for transmitting an internal address signal, according to an address activation signal.

An address decoder (row decoder) 9 comprises first and second decoding portions 9A and 9B, a switching portion 9C, and a latch portion 9D. The first decoding portion 9A decodes the external address signal transmitted through the first address bus 7, and the second decoding portion 9B decodes the internal address signal transmitted through the second address bus 8. The switching portion 9C selects one of the decoded results of the first and second decoding portions 9A and 9B, to choose a word line of a memory cell array 6. The latch portion 9D latches an output of the switching portion 9C.

A controller 10 determines an operation mode according to the address activation signal and controls the switching portion 9C of the row decoder 9.

According to the semiconductor memory of the second aspect of the invention, the external and internal address signals are transmitted through the first and second address buses 7 and 8 according to the address activation signal and decoded in the first and second decoding portions 9A and 9B of the row decoder 9 before the controller 10 determines an operation mode according to the address activation signal. One of the decoded results of the first and second decoding portions 9A and 9B is selected by the switching portion 9C according to the operation mode determined by the controller 10 and used to select a word line of the memory cell 6. This arrangement shortens the decoding time and increases the memory access speed.

Since an output of the switching portion 9C is latched by the latch portion 9D in selecting a word line, the first and second address buses 7 and 8 can be reset irrespective of resetting the selected word line when carrying out a chip reset operation. This shortens the reset time.

Figure 8:
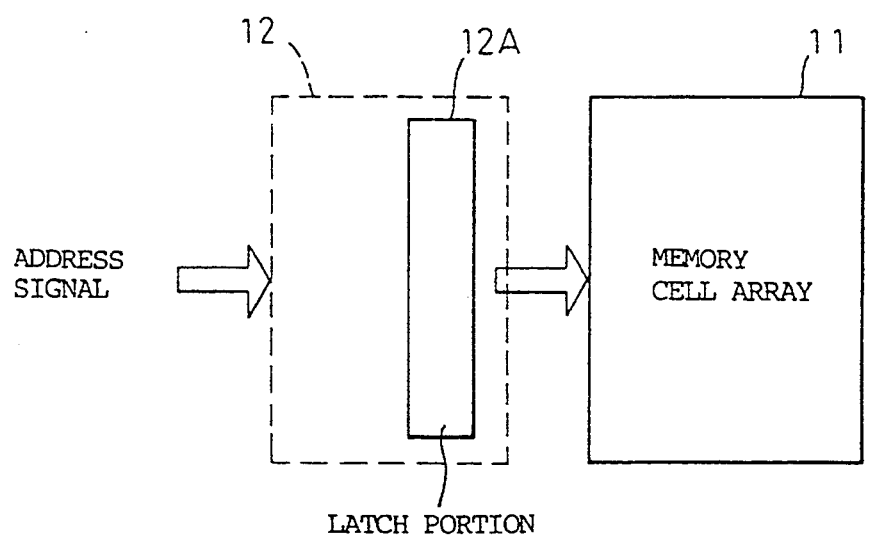
FIG. 8 is a block diagram showing a principle of a semiconductor memory according to a third aspect of the invention.

FIG. 8 is a block diagram showing a principle of a semiconductor memory according to a third aspect of the invention.

In FIG. 8, the semiconductor memory has an address decoder (row decoder) 12 for decoding an address signal. A latch portion 12A latches the decoded result and selects a memory cell in a memory cell array 11.

According to the semiconductor memory of the third aspect of the invention, a decoded result of the address decoder 12 is latched by the latch portion 12A in selecting a memory cell of the memory cell array 11. In a chip reset operation, the address signal can be reset irrespective of resetting the selected memory cell, thereby shortening the reset time.

Semiconductor memories according to embodiments of the invention will be explained with reference to FIGS. 9 to 17.

Figure 9:
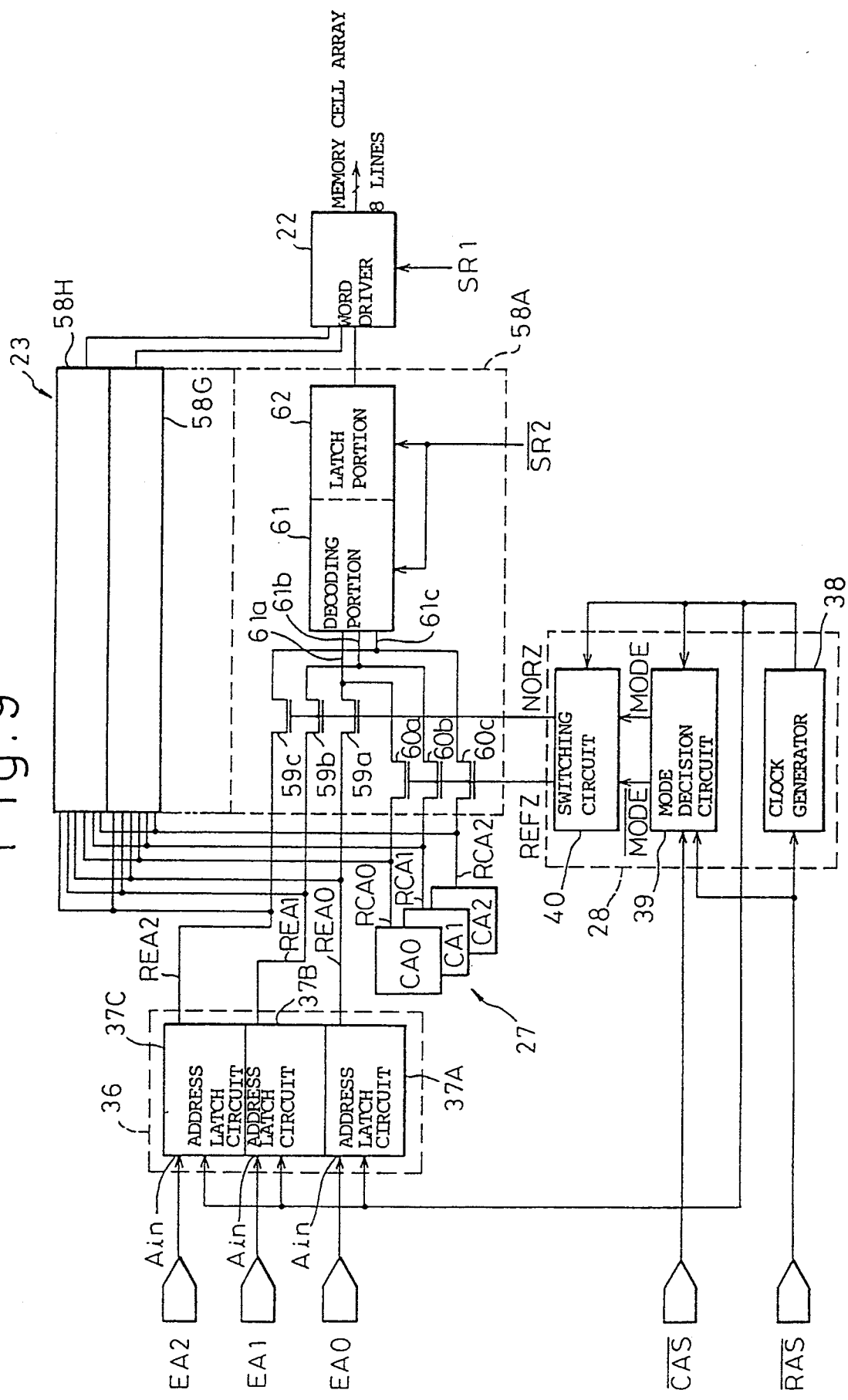
FIG. 9 is a block circuit diagram showing a semiconductor memory according to an embodiment of the invention.
Figure 12:
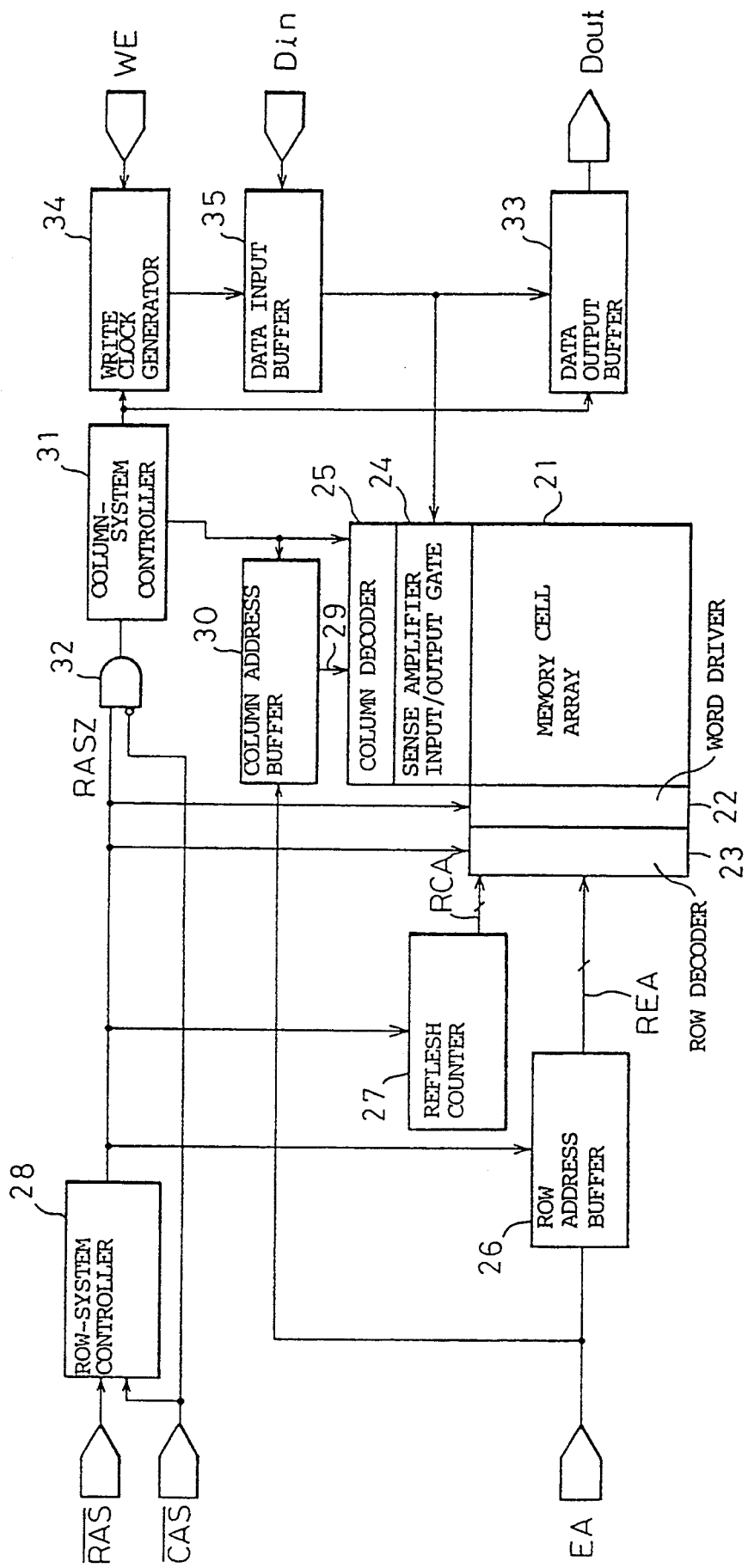
FIG. 12 is a block diagram schematically showing an example of a semiconductor memory.

FIG. 12 is a block diagram schematically showing a semiconductor memory, and FIG. 9 is a block circuit diagram showing a semiconductor memory according to an embodiment of the invention.

In FIG. 12, a memory cell array 21 comprises many memory cells. The memory cell array 21 is connected to a word driver 22, a row decoder 23, sense amplifiers with I/O gates 24, and a column decoder 25.

The row decoder 23 is connected to a row address buffer 26 through a first address bus REA and to a refresh address counter 27 through a second address bus RCA. The row address buffer 26 receives an external address signal EA made of a plurality of bits (three bits in this embodiment) from a controller (not shown) and provides the signal to the row decoder 23. The refresh address counter 27 provides the row decoder 23 with an internal address signal CA made of a plurality of bits (three bits in this embodiment).

According to the levels of a row address strobe signal $\overline{RAS}$ and column address strobe signal $\overline{CAS}$ serving as address activation signals, a row-system controller 28 controls the word driver 22, row decoder 23, row address buffer 26, and refresh address counter 27.

The column decoder 25 is connected to a column address buffer 30 through an address bus 29. The buffer 30 receives the external address signal EA made of a plurality of bits (three bits in this embodiment) from the controller and provides the signal to the column decoder 25.

An AND circuit 32 receives a control signal RASZ from the row-system controller 28 as well as the column address strobe signal $\overline{CAS}$. According to the level of an output signal of the AND circuit 32, a column-system controller 31 controls the sense amplifiers with I/O gates 24, column decoder 25, and column address buffer 30. The column-system controller 31 controls the data output buffer 33 during a read operation, to provide data Dout read out of the memory cell array 21.

A write clock generator 34 receives an output signal of the column-system controller 31 as well as a write control signal $\overline{WE}$ and controls a data input buffer 35, to receive write data Din during a write operation.

As shown in FIG. 9, the row address buffer 36 comprises three address latch circuits 37A to 37C serving as buffer cells. The address latch circuits 37A to 37C receive the bits EA0 to EA2, respectively, of the 3-bit external address signal EA, as well as a control signal RASX from a clock generator 38 to be explained later. When the control signal RASX is at level L, the address latch circuits 37A to 37C latch the bit data EA0 to EA2 supplied to input terminals Ain and transfer them to the row decoder 23 through signal lines REA0 to REA2 of the address bus REA.

As shown in FIG. 9, the row-system controller 28 comprises the clock generator 38, a mode decision circuit 39, and a switching circuit 40.

Figure 14:
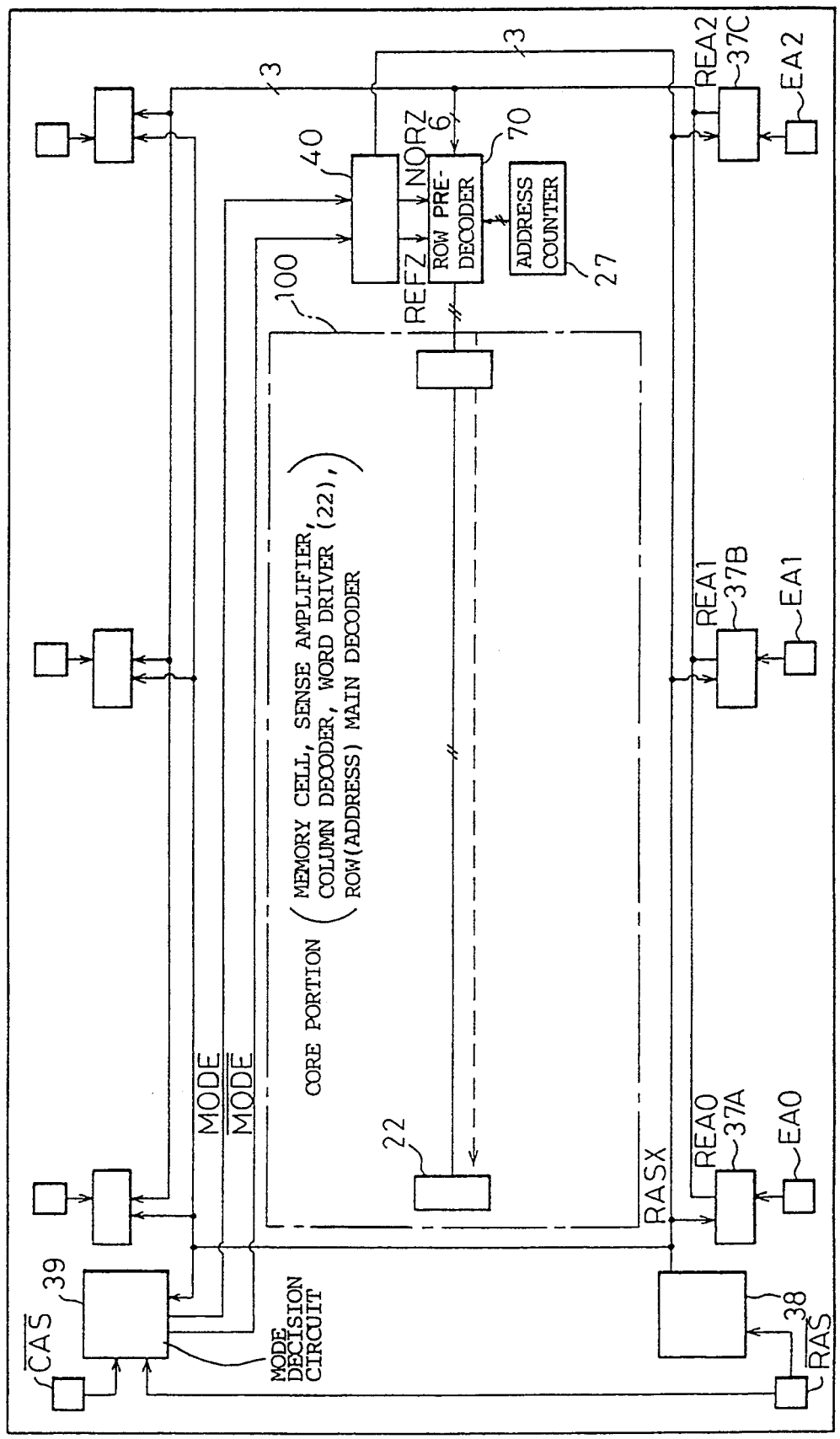
FIG. 14 is a chip layout of the semiconductor memory of FIG. 9.

FIG. 14 shows an actual chip layout of the semiconductor memory of FIG. 9. In the figure, a core portion 100 includes the memory cells, sense amplifiers, column decoder, word driver (22), and row (address) main decoder. FIGS. 14 and 2 will be compared with each other. In the conventional semiconductor memory of FIG. 2, the switching circuit 89 for receiving the output signals (mode signals) MODE and $\overline{MODE}$ of the mode decision circuit 87 is disposed in the vicinity of the mode decision circuit 87, and an output signal of the switching circuit 89 is supplied to the buffer cells 93A, 93B and so on. On the other hand, in the semiconductor memory of the invention of FIG. 14, the switching circuit 40 for receiving output signals (mode signals) MODE and $\overline{MODE}$ of the mode decision circuit 39 is disposed in the vicinity of a row decoder 70 (23), and an output signal of the switching circuit 40 is supplied to decoder cells of the row decoder 70 (23).

Figure 10:
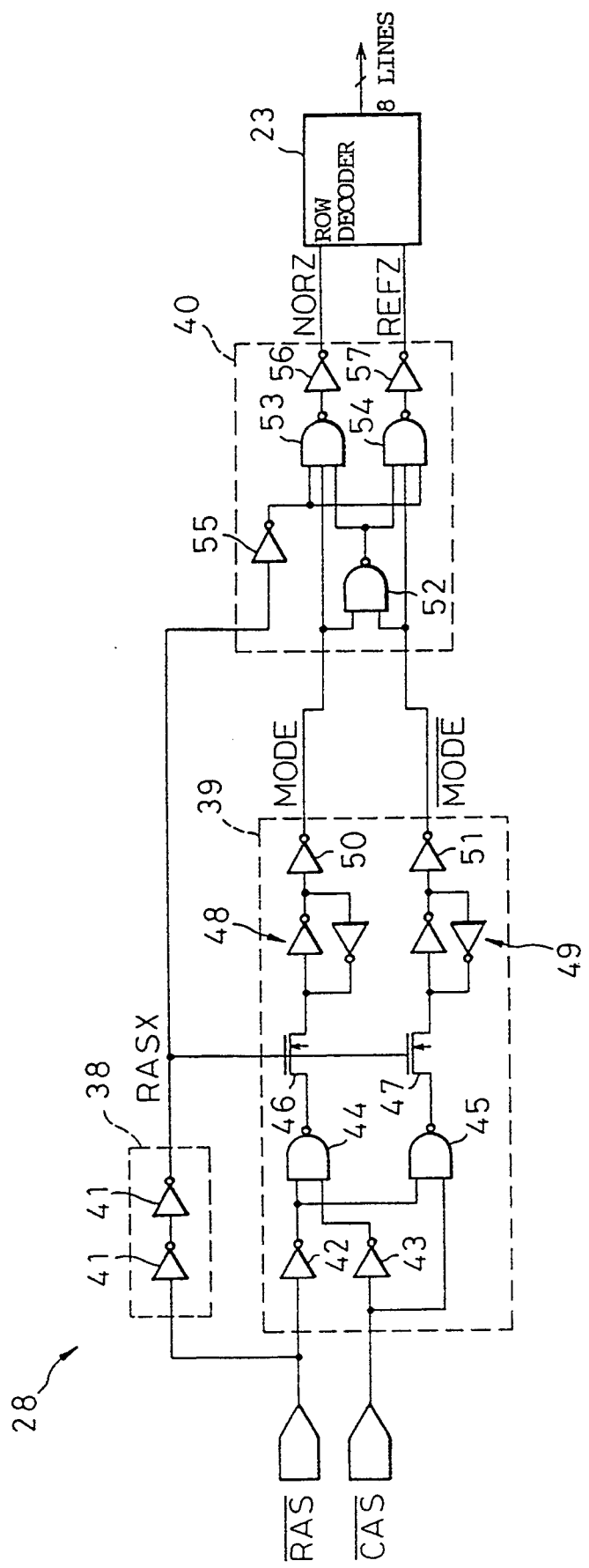
FIG. 10 is a circuit diagram showing an example of a row-system controller in the semiconductor memory of FIG. 9.

FIG. 10 is a circuit diagram showing an example of the row-system controller 28 of the semiconductor memory of FIG. 9.

In FIG. 10, the clock generator 38 has two inverters 41. According to the row address strobe signal $\overline{RAS}$, the clock generator 38 provides the control signal RASX to the mode decision circuit 39, switching circuit 40, and row address buffer 36 (FIG. 9).

A NAND circuit 44 of the mode decision circuit 39 receives, through inverters 42 and 43, the row address strobe signal $\overline{RAS}$ and column address strobe signal $\overline{CAS}$. A NAND circuit 45 receives the row address strobe signal $\overline{RAS}$ through the inverter 42 and the column address strobe signal $\overline{CAS}$. Each of latch circuits 48 and 49 comprises two inverters. Input terminals of the latch circuits 48 and 49 are connected to the NAND circuits 44 and 45 through NMOS transistors 46 and 47, respectively. Gate terminals of the NMOS transistors 46 and 47 receive the control signal RASX. Output terminals of the latch circuits 48 and 49 are connected to inverters 50 and 51, respectively.

When the row address strobe signal $\overline{RAS}$ changes to level L with the column address strobe signal $\overline{CAS}$ being at level H, the mode decision circuit 39 determines that it is a normal read/write operation and sets the mode signal MODE to level H and the mode signal $\overline{MODE}$ to level L. Namely, when the row address strobe signal $\overline{RAS}$ changes to level L, the NAND circuit 44 provides an output of level H and the NAND circuit 45 an output of level L. At this time, the control signal RASX of the clock generator 38 is still at level H to turn ON the NMOS transistors 46 and 47. As a result, the outputs of the NAND circuits 44 and 45 are transferred to the latch circuits 48 and 49 to set the mode signal MODE to level H and the mode signal $\overline{\text{MODE}}$ to level L.

When the row address strobe signal $\overline{\text{RAS}}$ changes to level L with the column address strobe signal $\overline{\text{CAS}}$ being at level L, the mode decision circuit 39 determines that it is a refresh operation of the memory cell array 21, and sets the mode signal MODE to level L and the mode signal $\overline{\text{MODE}}$ to level H. Namely, just before the control signal RASX of the clock generator 38 changes to level L, the NAND circuit 44 provides an output of level L and the NAND circuit 45 an output of level H, and the outputs of the NAND circuits 44 and 45 are latched by the latch circuits 48 and 49 to set the mode signal MODE to level L and the mode signal $\overline{\text{MODE}}$ to level H.

When the row address strobe signal $\overline{\text{RAS}}$ is at level H, the mode decision circuit 39 provides the mode signals MODE and $\overline{\text{MODE}}$ of level H.

The switching circuit 40 comprises NAND circuits 52 to 54 and inverters 55 to 57. The 2-input NAND circuit 52 receives the mode signals (complementary signals) MODE and $\overline{\text{MODE}}$. The 3-input NAND circuit 53 receives the mode signal MODE, an output signal of the NAND circuit 52, and the control signal RASX through the inverter 55. An output terminal of the 3-input NAND circuit 53 is connected to the inverter 56. The 3-input NAND circuit 54 receives the mode signal $\overline{\text{MODE}}$, the output signal of the NAND circuit 52, and the control signal RASX through the inverter 55. An output terminal of the 3-input NAND circuit 54 is connected to the inverter 57.

In the normal read/write operation with the mode signal MODE being at level H and mode signal $\overline{\text{MODE}}$ at level L, the switching circuit 40 provides the row decoder 23 with switching control signals NORZ of level H and REFZ of level L. In the refresh operation with the mode signal MODE being at level L and $\overline{\text{MODE}}$ at level H, the switching circuit 40 provides the row decoder 23 with switching control signals NORZ of level L and REFZ of level H. When the mode signals MODE and $\overline{\text{MODE}}$ are both at level H, the switching circuit 40 provides switching control signals NORZ and REFZ of each level L.

As shown in FIG. 9, the row decoder 23 comprises eight decoder cells 58A to 58H. Each of the decoder cells 58A to 58H comprises three first switches 59a to 59c, each comprising an NMOS transistor serving as a switching element, three second switches 60a to 60c, each comprising an NMOS transistor serving as a switching element, a decoding portion 61, and a latch portion 62. Drain terminals of the first switches 59a to 59c are connected to the signal lines REA0 to REA2, respectively, of the first address bus REA to receive bits EA0 to EA2 of the external address signal EA. Source terminals of the first switches 59a to 59c are connected to three input lines 61a to 61c, respectively, of the decoding portion 61. Gate terminals of the first switches 59a to 59c receive the switching control signal NORZ from the switching circuit 40. Drain terminals of the second switches 60a to 60c are connected to the signal lines RCA0 to RCA2, respectively, of the second address bus RCA to receive the bits CA0 to CA2 of the internal address signal CA from the refresh address counter 27. Source terminals of the second switches 60a to 60c are connected to the three input lines 61a to 61c, respectively, of the decoding portion 61. Gate terminals of the second switches 60a to 60c receive the switching control signal REFZ from the switching circuit 40.

In the normal read/write operation with the switching control signal NORZ being at level H, the three first switches 59a to 59c in each of the decoder cells 58A to 58H are turned ON to select the first address bus REA, so that the bit data EA0 to EA2 of the external address signal EA are supplied to the decoding portion 61. In the refresh operation with the switching control signal REFZ being at level H, the three second switches 60a to 60c in each of the decoder cells 58A to 58H are turned ON to select the second address bus RCA, so that the bit data CA0 to CA2 of the internal address signal CA are supplied to the decoding portion 61.

Figure 11:
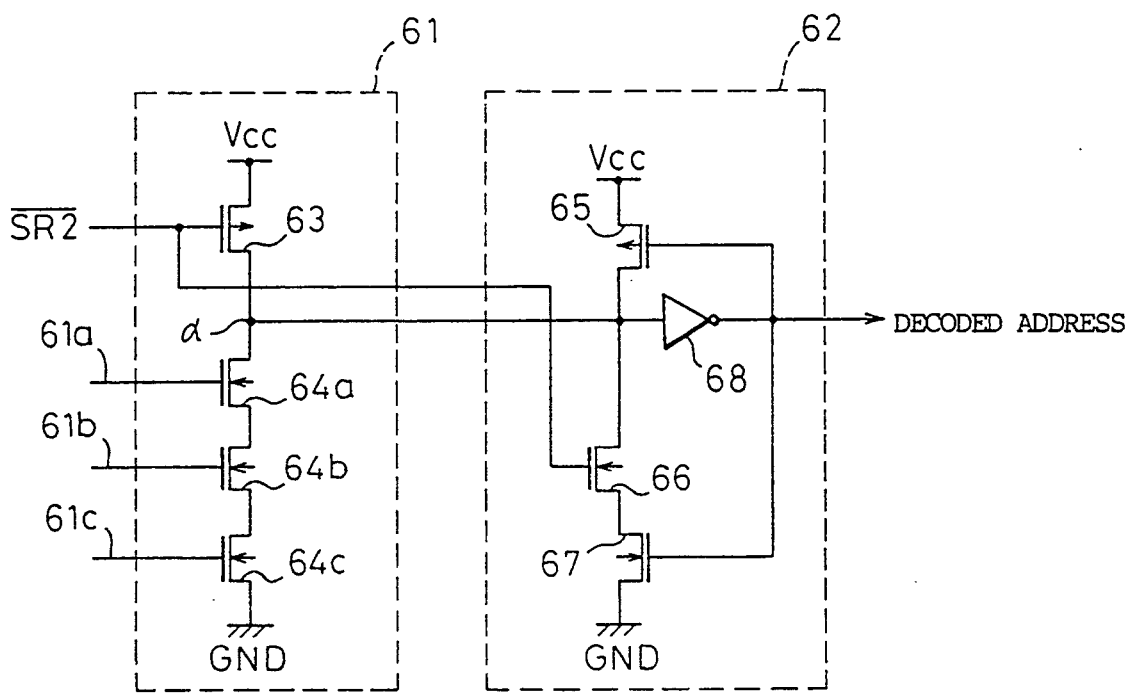
FIG. 11 is a circuit diagram showing examples of a decoding portion and latch portion in the semiconductor memory of FIG. 9.

FIG. 11 is a circuit diagram showing examples of the decoding portion 61 and latch portion 62 of the semiconductor memory of FIG. 9.

In FIG. 11, the decoding portion 61 comprises a PMOS charging transistor 63 and three NMOS decoding transistors 64a to 64c. These transistors are connected in series between a high-voltage source Vcc and a low voltage source GND. A gate terminal of the charging transistor 63 receives a reset signal $\overline{\text{SR2}}$. Only under a standby state, i.e., only when it is not the read/write operation nor the refresh operation, the reset signal $\overline{\text{SR2}}$ is set to level L to turn ON the charging transistor 63 to set a node $\alpha$ to level H. In the read/write operation and refresh operation, the gate terminals of the decoding transistors 64a to 64c receive the bit data EA0 to EA2 of the external address signal EA, or the bit data CA0 to CA2 of the internal address signal CA through the input lines 61a to 61c. When all of the decoding transistors 64a to 64c are turned ON, the node $\alpha$ is set to level L to complete a decoding process. Namely, when the bit data on the input lines 61a to 61c of the decoding portion 61 are each "1" (high level H), the decoder cell 58A carries out the decoding process.

The decoding portion 61 of any one of the decoder cells 58B to 58H differs from the decoding portion 60 of the decoder cell 58A in that the three decoding transistors 64a to 64c are a combination of PMOS and NMOS transistors.

The latch portion 62 comprises a PMOS transistor 65, NMOS transistors 66 and 67, and an inverter 68. These transistors are connected in series between the high voltage source Vcc and the low voltage source GND. A drain terminal of the PMOS transistor 65 is connected to an input terminal of the inverter 68 as well as to the node $\alpha$ of the decoding portion 61. Gate terminals of the PMOS and NMOS transistors 65 and 67 are connected to an output terminal of the inverter 68, to form an inverter. A gate terminal of the NMOS transistor 66 receives the reset signal $\overline{\text{SR2}}$, so that the transistor 66 may be turned ON in the read/write operation and refresh operation, and OFF under the standby state.

Accordingly, in the read/write operation and refresh operation, the level of the node $\alpha$ of the decoding portion 61 is latched by the inverter 68 and the PMOS and NMOS transistors 65 and 67, and an inversion of the level of the node $\alpha$ is provided as a decoded address to the word driver 22. In the standby state, the inverter 68 receives an input of level H to provide a decoded address of "0" (low level L).

An operation of the above semiconductor memory is now explained.

Figure 13:
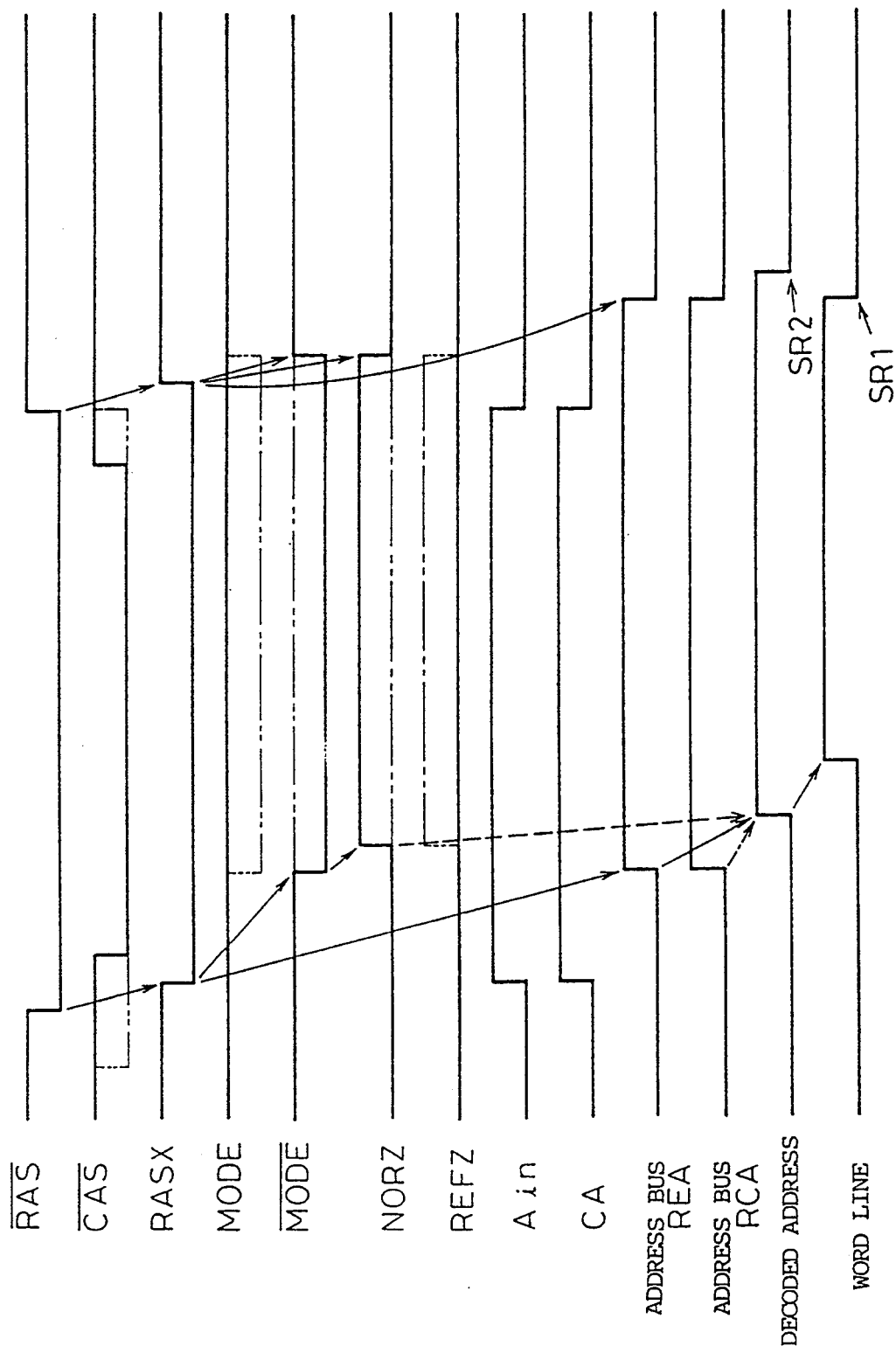
FIG. 13 is a timing chart explaining operations of the semiconductor memory of FIG. 9.

FIG. 13 is a timing chart explaining an operation of the semiconductor memory of FIG. 9. When the row address strobe signal $\overline{\text{RAS}}$ changes to level L with the column address strobe signal $\overline{\text{CAS}}$ being at level H, the normal read/write operation is carried out. When the row address strobe signal $\overline{RAS}$ changes to level L, the control signal RASX from the clock generator 38 changes to level L. In synchronism with this, the input terminals Ain of the address latch circuits 37A to 37C of the row address buffer 36 receive the bit data EA0 to EA2 of the external address signal EA (FIG. 9). Accordingly, the address latch circuits 37A to 37C latch the bit data EA0 to EA2 and transfer them to the row decoder 23 through the signal lines REA0 to REA2 of the first address bus REA.

When the row address strobe signal $\overline{RAS}$ changes to level L with the column address strobe signal $\overline{CAS}$ being at level H, the mode decision circuit 39 determines that it is the read/write operation and provides a mode signal $\overline{MODE}$ of level L. As a result, the switching circuit 40 changes the switching control signal NORZ to level H to turn ON the first switches 59a to 59c in each of the decoder cells 58A to 58H of the row decoder 23, thereby selecting the signal lines REA0 to REA2 of the first address bus REA and providing every decoding portion 61 with the bit data EA0 to EA2 of the external address signal EA. The decoding portion 61 of one of the decoder cells 58A to 58H decodes the external address signal EA and transfers the decoded address to the word driver 22 through signal lines. The word driver 22 then selects a word line.

As indicated with dash-and-two-dots lines in FIG. 13, when the row address strobe signal $\overline{RAS}$ changes to level L with the column address strobe signal $\overline{CAS}$ being at level L, the refresh operation is carried out. When the control signal RASX of the clock generator 38 is changed to level L, the input terminals Ain of the address latch circuits 37A to 37C of the row address buffer 36 receive the bit data EA0 to EA2 of the external address signal EA, and the bit data EA0 to EA2 are latched by the address latch circuits 37A to 37C.

When the mode decision circuit 39 determines that it is the refresh operation, the mode signal MODE changes to level L as indicated with a dash-and-two-dots line. Then, the switching control signal REFZ of the switching circuit 40 changes to level H as indicated with a dash-and-two-dots line to turn ON the second switches 60a to 60c in each of the decoder cells 58A to 58H of the row decoder 23, thereby selecting the signal lines RCA0 to RCA2 of the second address bus RCA and transferring the bit data CA0 to CA2 of the internal address signal CA to the decoding portion 61. The decoding portion 61 of one of the decoder cells 58A to 58H decodes the internal address signal CA and transfers the decoded address to the word driver 22 through signal lines, thereby selecting a word line.

A chip reset operation is now explained. When the chip reset operation is carried out, the latch portion 62 is latching a decoded result of the decoding portion 61 and a word line is being selected. When the row address strobe signal $\overline{RAS}$ changes to level H and the control signal RASX of the clock generator 38 to level H as shown in FIG. 13, the mode signal MODE or $\overline{MODE}$ of the mode decision circuit 39 is returned to level H, and the first and second address buses REA and RCA are reset. Also, when the row address strobe signal $\overline{RAS}$ changes to level H and the control sinal RASX of the clock generator 38 to level H, the switching control signals NORZ and REFZ of the switching circuit 40 are changed to level L.

Thereafter, the selected word line is reset in response to the reset signal SR1, and the decoding portion 61 and latch portion 62 in each of the decoder cells 58A to 58H are reset in response to the reset signal $\overline{SR2}$, thereby completing the chip reset operation.

In this way, this embodiment arranges the first and second address buses REA and RCA, and transfers the external address signal EA and the internal address signal CA of the refresh address counter 27 to the row decoder 23 according to the control signal RASX of the clock generator 38. Accordingly, this embodiment can reduce the transferring time of an address signal to the row decoder 23, to shorten the decoding time and improving the memory access speed.

According to the embodiment, a decoded result of the decoding portion 61 is latched by the latch portion 62 and used to select a word line. When carrying out a chip reset operation, the embodiment resets the first and second address buses REA and RCA irrespective of resetting the selected word line, thereby shortening the reset time and cycle time.

Figure 15:
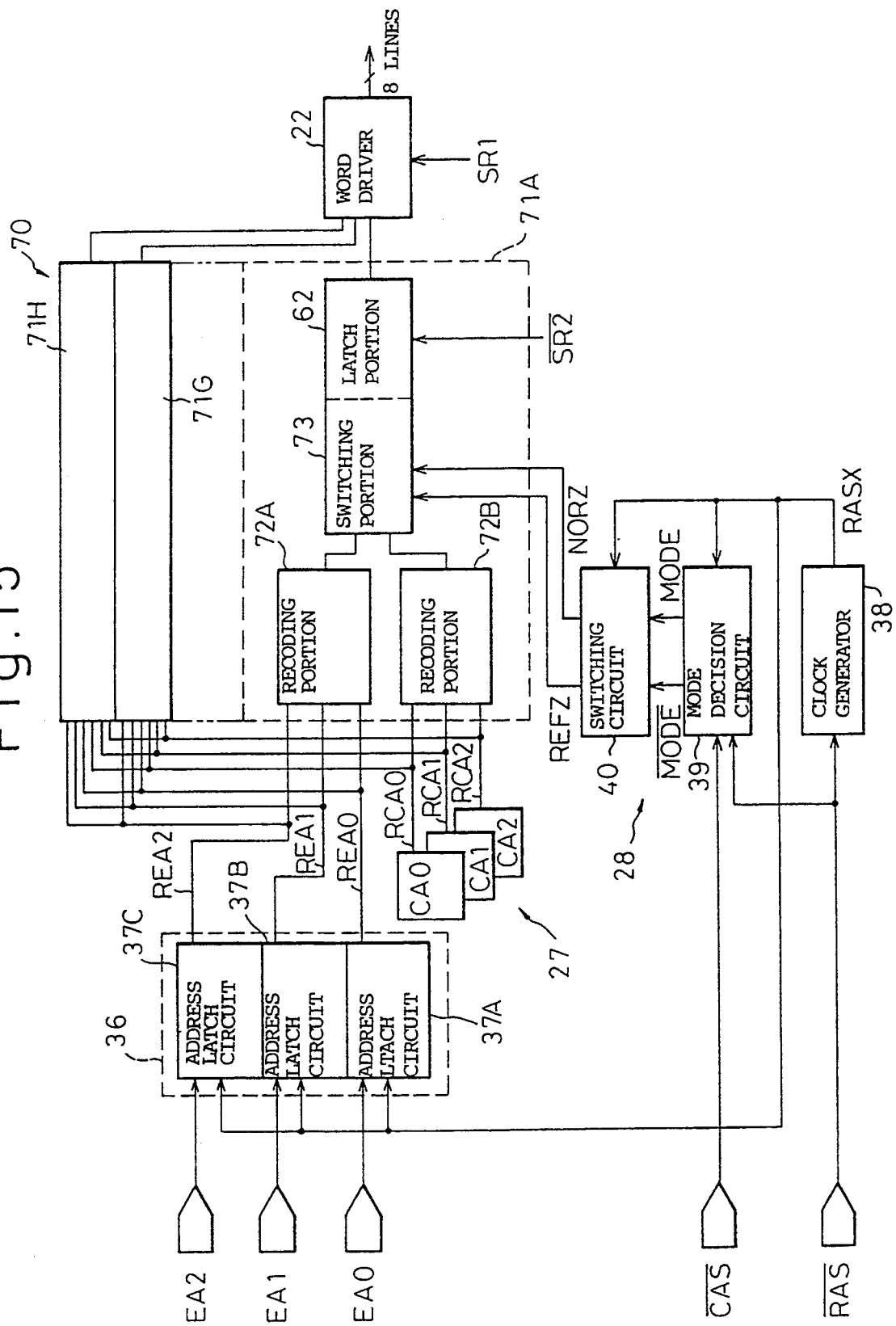
FIG. 15 is a block circuit diagram showing a semiconductor memory according to another embodiment of the invention.
Figure 16:
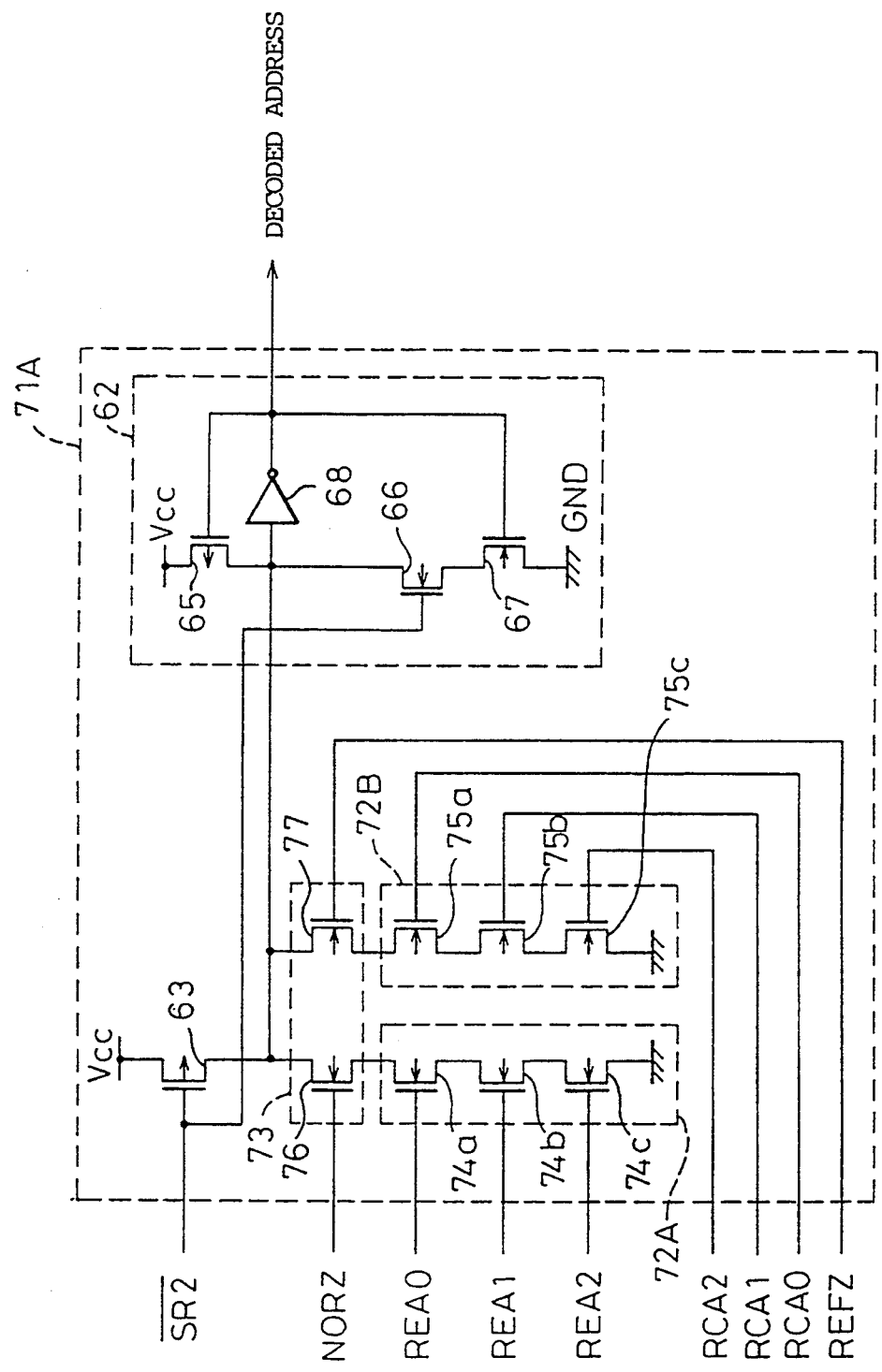
FIG. 16 is a circuit diagram showing a decoder cell in the semiconductor memory of FIG. 15.

FIG. 15 is a block circuit diagram showing a semiconductor memory according to another embodiment of the invention, and FIG. 16 is a circuit diagram showing a decoder cell of the semiconductor memory of FIG. 15. In these figures, the same parts as those explained with reference to the embodiment of FIGS. 9 to 12 are represented with like reference marks, and their explanations are not repeated.

In FIG. 15, a row decoder 70 comprises eight decoder cells 71A to 71H. Each of the decoder cells 71A to 71H comprises first and second decoding portions 72A and 72B, a switching portion 73, and a latch portion 62.

As shown in FIG. 16, the first decoding portion 72A comprises three NMOS decoding transistors 74a to 74c connected in series. Gate terminals of the decoding transistors 74a to 74c are connected to signal lines REA0 to REA2, respectively, of a first address bus REA. In a read/write operation and a refresh operation, the first decoding portion 72A decodes an external address signal EA. The second decoding portion 72B comprises three NMOS decoding transistors 75a to 75c connected in series. Gate terminals of the decoding transistors 75a to 75c are connected to signal lines RCA0 to RCA2, respectively, of a second address bus RCA. In the read/write operation and refresh operation, the second decoding portion 72B decodes an internal address signal CA.

The switching portion 73 comprises an NMOS transistor 76 disposed between the first decoding portion 72A and a charging transistor 63, and an NMOS transistor 77 disposed between the second decoding portion 72B and the charging transistor 63. Gate terminals of the NMOS transistors 76 and 77 receive switching control signals NORZ and REFZ, respectively, from the switching circuit 40. In the normal read/write operation with the switching control signal NORZ being at level H, the NMOS transistor 76 is turned ON so that a decoded result of the first decoding portion 72 is provided to the latch portion 62. In the refresh operation with the switching control signal REFZ being at level H, the NMOS transistor 77 is turned ON so that a decoded result of the second decoding portion 72B is provided to the latch portion 62.

The first and second decoding portions 72A and 72B in any one of the decoder cells 71B and 71H differ from the first and second decoding portions 72A and 72B of the decoder cell 71A in that each three decoding transistors 74a to 74c and 75a to 75c are formed of a combination of PMOS and NMOS transistors.

In this way, this embodiment also arranges the first and second address buses REA and RCA, transfers the external address signal EA and the internal address signal CA of the refresh address counter 27 to the row decoder 70 according to the control signal RASX of the clock generator 38, decodes the external address signal EA and internal address signal CA in the first and second decoding portions 72A and 72B, respectively, and selects one of the decoded results. This arrangement shortens the decoding time and improves the memory access speed.

According to this embodiment, a decoded result of any one of the first and second decoding portions 72A and 72B selected by the switching portion 73 is latched by the latch portion 62 and used to select a word line. When carrying out a chip reset operation, this embodiment can reset the first and second address buses REA and RCA irrespective of resetting the selected word line, thereby shortening the reset time and cycle time.

Figure 17:
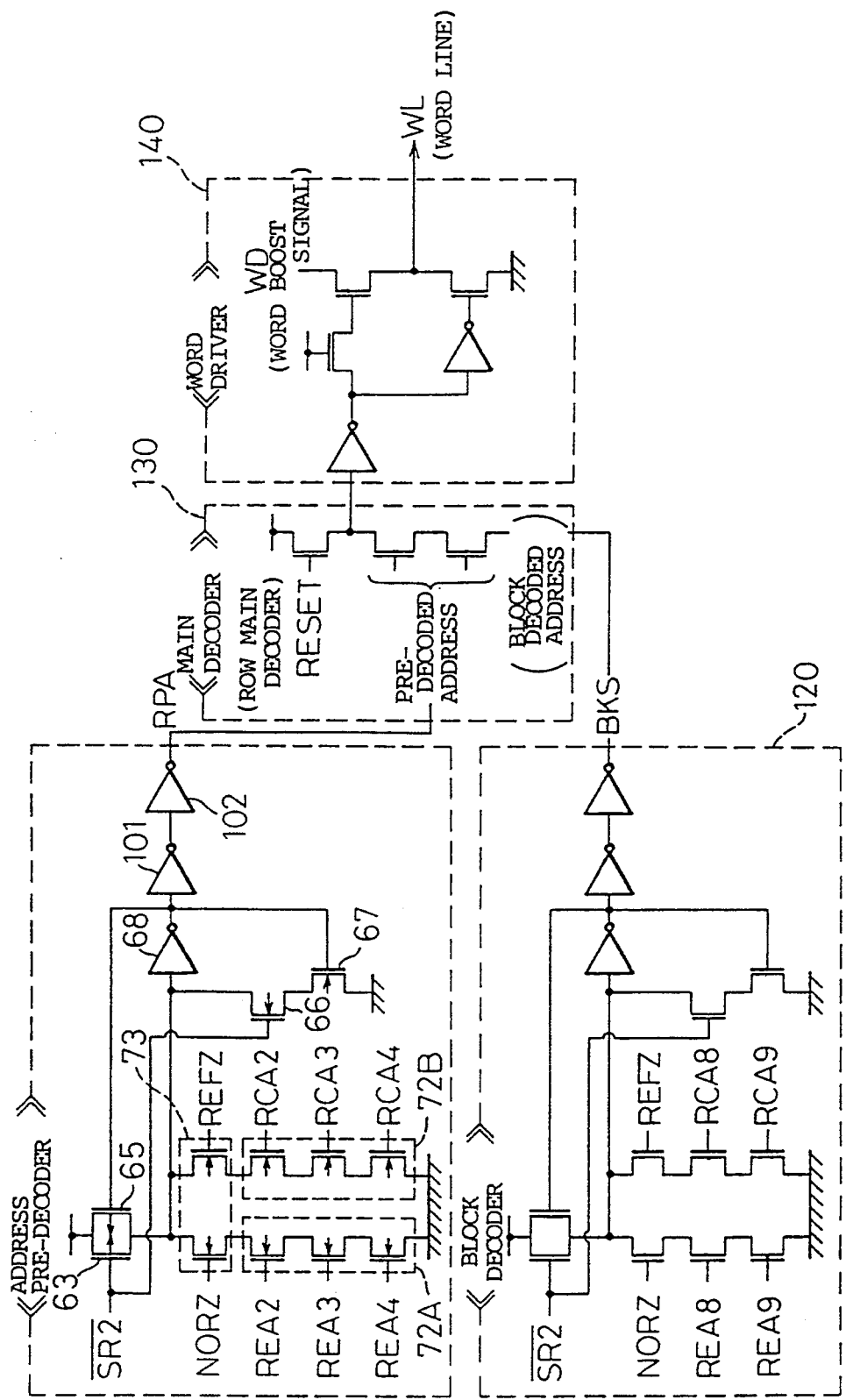
FIG. 17 is a circuit diagram showing a row decoder and word driver with the decoder cell of FIG. 16 serving as a predecoder.

FIG. 17 is a circuit diagram showing a row decoder and a word driver with the decoder cell of FIG. 16 serving as a predecoder. In the figure, the embodiment comprises an address predecoder (row predecoder) 71A', a block decoder 120, a main decoder (row main decoder) 130, and a word driver 140.

The row predecoder 71A' has the same arrangement as the decoder cell 71A of FIG. 16. The row predecoder 71A' of FIG. 17, however, has two inverters 101 and 102 for providing a predetermined output level. In FIG. 14, the row main decoder 130 is disposed in the vicinity of the word driver 22 (140), and the inverters 101 and 102 are arranged in an output stage of the row predecoder 71A', to secure a potential required between the row decoder 70 (row predecoder 71A') and the row main decoder (130) disposed in the vicinity of the word driver 22. Similarly, two inverters are disposed in an output stage of the block decoder 120.

As shown in FIG. 17, the decoder cell according to the invention can serve as a predecoder of a semiconductor memory (DRAM).

A gate terminal of a charging transistor 63 of the row predecoder 71A' receives a reset signal SR2. Only in a standby state, i.e., only when it is not a read/write operation nor a refresh operation, the reset signal $\overline{SR2}$ is set to level L to turn ON the charging transistor 63 to set a node α to level H. The reset signal $\overline{SR2}$ is also applied to a gate terminal of an NMOS transistor 66. The transistor 66 is turned ON at the read/write operation and refresh operation, and OFF in the standby state. A gate of a transistor 131 of the main decoder 130 receives a reset signal RESET. Gates of transistors 132 and 133 of the main decoder 130 receive a predecoded address from the row predecoder (71A').

More precisely, the semiconductor memory of FIG. 17 is, for example, a 4-megabit DRAM. The block decoder 120 selects one megabit among the four megabits, and among the selected one megabit, the 3-bit-input row predecoder (71A') chooses one of eight selections. Thereafter, two systems of row predecoders of the main decoder 130 select 64 kilobits among the one megabit. The word driver 140 may choose one of four selections, and the main decoder 130 may select 16 kilobits.

In the semiconductor memories according to the embodiments of the invention, each decoder cell of the row decoders 23 and 70 has a latch portion for latching a decoded result. The latch portion may be arranged in the column decoder 25. When the column decoder 25 is provided with a latch portion, a decoded result from an address decoder (a row decoder or a column decoder) is latched by the latch portion to select a memory cell in the memory cell array 21. When carrying out a chip reset operation, this arrangement may reset an address signal irrespective of resetting the selected memory cell, thereby shortening the reset time.

As explained above in detail, a semiconductor memory according to the first aspect of the invention transfers external and internal address signals to a row decoder through first and second address buses according to an address activation signal before an operation mode is determined. This aspect, therefore, shortens the transfer time, improves the decoding speed, and achieves a high-speed memory access. According to this aspect, a decoded result of a decoding portion is latched by a latch portion and used to select a word line, so that, when carrying out a chip reset operation, this aspect may reset the first and second address buses irrespective of resetting the selected word line, thereby shortening the reset time and cycle time.

A semiconductor memory according to the second aspect of the invention transfers external and internal address signals to first and second decoding portions of a row decoder through first and second address buses according to an address activation signal, and decodes the signals in the decoding portions before an operation mode is determined. This arrangement shortens the decoding time and achieves a high-speed memory access. Since an output of a switching portion is latched by a latch portion and used to select a word line, the first and second address buses can be reset in a chip reset operation irrespective of resetting the selected word line, thereby shortening the reset time and cycle time.

A semiconductor memory according to the third aspect of the invention has a latch portion for latching a decoded result from an address decoder. The latched data is used to select a memory cell in a memory cell array. When carrying out a chip reset operation, this arrangement can reset address signals irrespective of resetting the selected memory cell, thereby shortening the reset time.

I claim:

1. A semiconductor memory comprising:
   a memory cell array having word lines;
   a first address bus for transmitting an external address signal according to an address strobe signal;
   a second address bus for transmitting an internal address signal according to the address strobe signal;
   an address decoder for receiving said external address signal from said first address bus and said internal address signal from said second address bus; and
   a controller for determining an operation mode of said semiconductor memory, according to the address strobe signal, and providing a corresponding operation mode signal indicative of said determined operation mode to said address decoder after said address decoder receives said external address signal and said internal address signal,
   wherein said address decoder has a switching portion for selecting, in response to said corresponding operation mode signal, one of said received external address signal and said received internal address signal, and a decoding portion for decoding said selected one of said external address signal transferred through said first address bus and said internal address signal transferred through said second address bus and for selecting one of said word lines of said memory cell array based on said decoded selected one of said external address signal and said internal address signal.

2. A semiconductor memory according to claim 1, wherein the address decoder further comprises a latch portion for latching said decoded one of said external and internal address signals of said decoding portion.

3. A semiconductor memory according to claim 1, wherein the address decoder serves as a row decoder for a dynamic random access memory.

4. A semiconductor memory according to claim 3, wherein the address decoder further comprises a predecoder of the row decoder.

5. A semiconductor memory comprising:
a memory cell array having word lines;
a first address bus for transmitting an external address signal according to an address activation signal;
a second address bus for transmitting an internal address signal according to the address activation signal;
a controller for determining an operation mode of said semiconductor memory, according to the address activation signal, and outputting a corresponding operation mode signal indicative of said determined operation mode; and
an address decoder having:
　a first decoding portion for decoding said external address signal transmitted through said first address bus,
　a second decoding portion for decoding said internal address signal transmitted through said second address bus, and
　a switching portion for selecting one of said decoded external address signal and said internal address signal, in response to said corresponding operation mode signal, for choosing one of said word lines of said memory cell array.

6. A semiconductor memory according to claim 5, wherein the address decoder further has a latch portion for latching an output of the switching portion.

7. A semiconductor memory according to claim 5, wherein the address decoder serves as a row decoder for a dynamic random access memory.

8. A semiconductor memory according to claim 7, wherein the address decoder further comprises a predecoder of the row decoder.

9. A semiconductor memory comprising:
a memory cell array having at least one memory cell;
at least one address bus for transmitting a respective address signal;
an address decoder for receiving said at least one respective address signal; and
a controller for providing a control signal,
wherein said address decoder, has a decoding portion for decoding said at least one respective address signal, and a latch portion for latching said decoded address signal, said decoding portion carrying out a decoding operation in response to the control signal and said latching portion carrying out a latching operation in response to the same control signal, for selecting one of said at least one memory cell of said memory cell array.

10. A semiconductor memory according to claim 9, wherein the address decoder serves as a row decoder for a dynamic random access memory.

11. A semiconductor memory according to claim 10, wherein the address decoder further comprises predecoder of the row decoder.

* * * * *

UNITED STATES PATENT AND TRADEMARK OFFICE
CERTIFICATE OF CORRECTION

PATENT NO. : 5,394,373
DATED : February 28, 1995
INVENTOR(S) : Satoru KAWAMOTO

It is certified that error appears in the above-indentified patent and that said Letters Patent is hereby corrected as shown below:

Col. 2, line 16, after "array", insert a comma (",").

Col. 3, line 50, after "83", insert a comma (",");
   Line 60, delete "e,ovs/RAS/" and insert therefor --RAS--.

Col. 16, line 32, after "comprises", insert --a--.

Signed and Sealed this

Fourth Day of July, 1995

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,394,373
DATED : February 28, 1995
INVENTOR(S) : Satoru KAWAMOTO

It is certified that error appears in the above-indentified patent and that said Letters Patent is hereby corrected as shown below:

Title Page: [73], Assignee, after "Japan", insert --Fujitsu VLSI Limited, Kasugai, Japan--.

Signed and Sealed this

Twelfth Day of September, 1995

Attest:

BRUCE LEHMAN

*Attesting Officer*  *Commissioner of Patents and Trademarks*